(12) United States Patent
Jonas et al.

(10) Patent No.: US 7,665,312 B2
(45) Date of Patent: Feb. 23, 2010

(54) METHOD OF USING A SYSTEM INCLUDING AN ASSEMBLY EXPOSED TO A CRYOGENIC REGION

(75) Inventors: Philip A. Jonas, Delmar, NY (US);
Ronald E. Hintz, Corinth, NY (US);
Glen G. Pfleiderer, Voorheesville, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 512 days.

(21) Appl. No.: 11/339,134

(22) Filed: Jan. 25, 2006

(65) Prior Publication Data
US 2007/0173715 A1 Jul. 26, 2007

(51) Int. Cl.
*F25B 19/00* (2006.01)
*H01F 6/00* (2006.01)
(52) U.S. Cl. .................. 62/51.1; 335/216; 324/318
(58) Field of Classification Search .......... 335/216; 324/318–320; 62/51.1
See application file for complete search history.

(56) References Cited
U.S. PATENT DOCUMENTS

| | | | |
|---|---|---|---|
| 4,986,077 A | 1/1991 | Saho et al. | |
| 4,995,237 A | * 2/1991 | Strasser | 62/93 |
| 5,220,800 A | 6/1993 | Muller et al. | |
| 5,430,423 A | * 7/1995 | Herd et al. | 335/216 |
| 5,586,437 A | 12/1996 | Blecher et al. | |
| 5,947,960 A | 9/1999 | Griswold | |
| 2005/0193745 A1 | 9/2005 | Mangano et al. | |

OTHER PUBLICATIONS

International Search Report and Written Opinion for PCT/US07/002031 dated Sep. 17, 2008, 8 pgs.
International Preliminary Report for PCT/US07/002031 dated Sep. 17, 2008, 5 pages.

* cited by examiner

*Primary Examiner*—Ramon M Barrera (57) ABSTRACT

A method can be used to perform an operation on a system that includes an assembly and a vessel that includes a wall and a thermal shield. The method can include breaking a thermal connection between the assembly and the thermal shield, separating the assembly and a surface within the vessel from each other, or any combination thereof. The method can also include changing a pressure with the vessel to be closer to atmospheric pressure, heating the assembly, or any combination thereof. In one embodiment, the method can be performed while keeping a cryogenic region substantially sealed, keeping a superconducting magnet energized, or a combination thereof. In a particular embodiment, the method can be used when servicing the assembly, such as a cryocooler.

11 Claims, 6 Drawing Sheets

METHOD OF USING A SYSTEM INCLUDING AN ASSEMBLY EXPOSED TO A CRYOGENIC REGION

BACKGROUND

1. Field of the Disclosure

The disclosure relates to methods of using systems, and more particularly to methods of using systems including assemblies exposed to cryogenic regions.

2. Description of the Related Art

Figure 1:
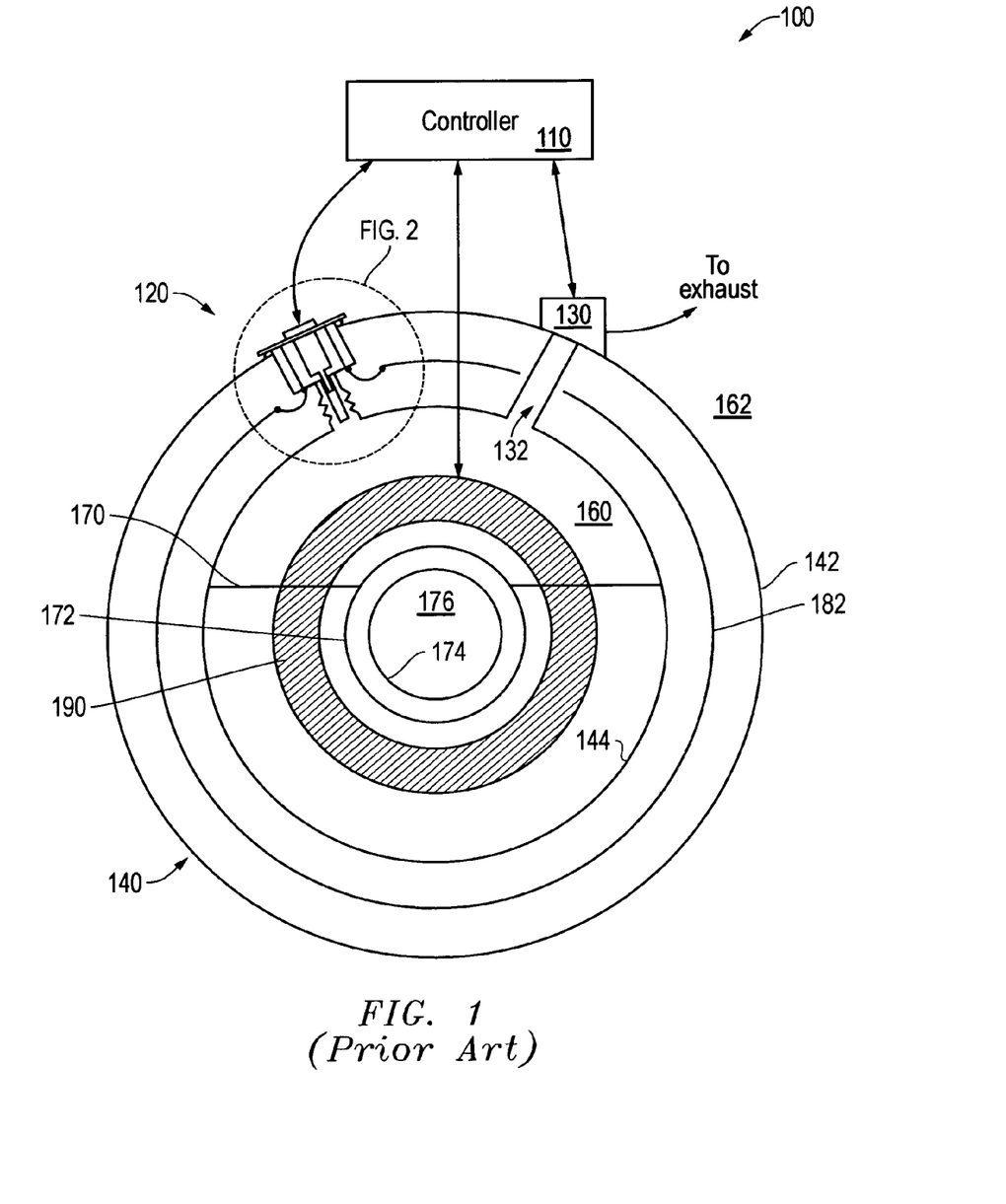
FIG. 1 includes a schematic drawing of an MRI system. (Prior art)

FIG. 1 includes a schematic drawing of a conventional magnetic resonance imaging ("MRI") system 100 that includes a superconducting magnet 190 that is contained within a vessel 140. The vessel 140 includes a shell having an outer wall 142 and an inner wall 144. The outer wall 142 is exposed to an ambient 162 that includes air substantially at room temperature (approximately 295 to 305 K) and atmospheric pressure (approximately zero gauge pressure). An interior space 160 lies within the inner wall 144. The vessel 120 can include another wall 172. The superconducting magnet 190 can be in its superconducting state by at least partial immersion of the superconducting magnet 190 within a bath of liquid cryogen (below line 170), typically helium. A thermal shield 182 is disposed between the outer and inner walls 142 and 144.

The MRI system 110 also includes a patient wall 174 with a space 176 in which a patient (not illustrated) may be placed when using the MRI system 110 during normal operation. The MRI system 100 also includes a cryocooler 120, which is described in more detail with respect to FIG. 2. The MRI system 100 further includes an exhaust port 132 and an exhaust assembly 130 connected to an exhaust.

The MRI system 100 still further includes a controller 110 that controls operation of the MRI system 100, including the superconducting magnet 190, the cryocooler 120, the exhaust assembly 130, potentially one or more other components (not illustrated), or any combination thereof of the MRI system 100. Although not illustrated, more than one controller 110, cryocooler 120, exhaust assembly 130, or any combination thereof may be used. The controller 110 can be bi-directionally coupled (illustrated by the double-headed arrows in FIG. 1) to the superconducting magnet 190, the cryocooler 120, the exhaust assembly 130, one or more of the potentially other components, or any combination thereof. In another embodiment, one or more of the bi-directional couplings may be replaced by uni-directional couplings. In addition, the controller 110 may be replaced by or used in conjunction with a different controller 110 when servicing the MRI system 100. The schematic drawing in FIG. 1 is merely to better illustrate the methods as described herein, and therefore, other features, such as electrical feedthroughs for supplying power to the superconducting magnet 190, are not illustrated.

Figure 2:
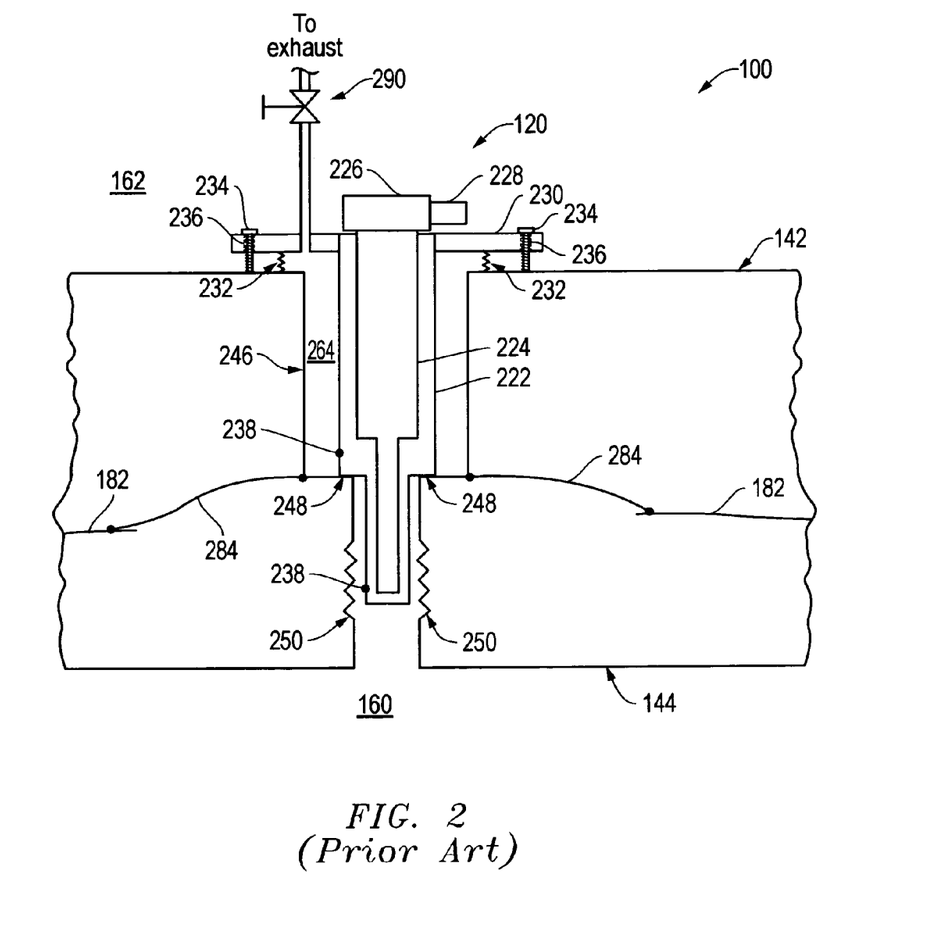
FIG. 2 includes an enlarged schematic drawing of a portion of the MRI system of FIG. 1 near a cryocooler. (Prior art.)

FIG. 2 includes a schematic drawing of a portion of the MRI system 100 that includes the cryocooler 120. The cryocooler 120 includes a housing 222 and a cooling sub-assembly 224. The cooling sub-assembly 224 can include a piston, a linkage to an external portion 226, a motor 228, another suitable component, or any combination thereof. A flange 230 is attached to the housing 222 and a bellows seal 232. The bellows seal 232 may be attached to the outer wall 142. The ambient 162 lies outside the bellows seal 232 and adjacent to the outer wall 142. The flange 230 can be attached to the outer wall 142 using securing elements 234 that extend through holes 236 in the flange 230. The securing elements 234 can include bolts, screws, nuts, springs, or any combination thereof.

The MRI system 100 also includes a transitional wall 246 disposed between the outer wall 142 and the inner wall 144. The transitional wall 246 includes a relatively wider portion closer to the outer wall 142 and a relatively narrower portion closer to the inner wall 144. After the securing elements 234 are tightened, the housing 222 can be in contact with a surface of the transitional wall 246 at area 248. A flexible portion 250 within the transitional wall 246 may allow for movement between the outer wall 142 and the inner wall 144. The transitional wall 246 is thermally connected to the thermal shield 182 using a thermally conductive element 284. In one particular embodiment, a copper braided strap may be used for the thermally conductive element 284 and may be attached to both the thermal shield 182 and the transitional wall 246 near the area 248. Thermal elements 238 are used to heat the housing 222 during servicing and are attached to the housing 222. A manual valve 290 is used to allow vapor from the transitional space 264 to flow to the exhaust.

During normal operating conditions, the internal space 160 may be maintained at a temperature in a range of approximately 3 to 5 K, and a transitional space 264 may have a temperature that varies from approximately 40 K closer to the area 248 of the transitional wall 246 and another temperature closer to room temperature near the flange 230. The cryocooler 120 is exposed to the cryogen within the cryogenic region.

A conventional method of servicing a cryocooler for an MRI system can include removing the entire cryocooler. Before removing the cryocooler, the superconducting magnet is ramped down to a substantially zero magnetic field, and the internal space surrounding the superconducting magnet is de-pressurized. The housing of the cyrocooler may be heated to a temperature above the freezing point of water (approximately 273 K). Heating elements within the cyrocooler can be activated and controlled by an external controller to heat the housing and increase the temperature to reduce the likelihood of ice formation. When the cryocooler is thermally connected to thermal shield, the heating has to compensate for the heat sink effect of the thermal shield, and thus a substantially amount of energy may be consumed to heat the cryocooler and the thermal shield.

The liquid cryogen used to maintain the superconducting state of the superconducting magnet can be susceptible to heat and air. Heat can enter the interior space during servicing both from warm (ambient) air that enters, and by heat that is conducted along parts of the MRI system that remain (e.g., along the transitional wall, the inner wall, and potentially other thermally conductive elements within magnet subsystem). If the heating, whether by air or thermal conduction, is significant a quench event can occur, causing almost all of the cryogen to boil off nearly instantaneously. Thus, too much heating can be dangerous.

Additionally, room air can cause problems. If a component, such as the cryocooler, is exposed to air at room temperature and later taken below 60 K, ice can form. When liquid helium is used as the cryogen, ice can come from moisture, nitrogen, oxygen, argon, or any combination thereof. Ice can reduce the likelihood of forming a good thermal connection between the cryocooler and the transitional wall or other portions (e.g., a thermal shield) that are to be cooled, thus, substantially decreasing the efficiency of the cryocooler after servicing.

Still further, a significant amount of cryogen can be lost by ramping down the superconducting magnet to substantially zero field and ramping up the superconducting magnet back to its normal operating field. Additionally, ramping down and then ramping back up takes time and requires specialized equipment and trained personnel, thereby increasing the unavailability of the MRI system and the cost of the service.

BRIEF DESCRIPTION OF THE DRAWINGS

The present disclosure may be better understood, and its features and advantages made apparent to those skilled in the art by referencing the accompanying drawings and the description of the drawings within this specification.

The use of the same reference symbols in different drawings indicates similar or identical items. Skilled artisans will appreciate that elements in the figures are illustrated for simplicity and clarity and have not necessarily been drawn to scale.

DETAILED DESCRIPTION

A method can be used to perform an operation on a system including an assembly and a vessel that includes a wall and a thermal shield. The method can include breaking a thermal connection between the assembly and the thermal shield, separating the assembly and a surface within the vessel from each other, or any combination thereof. The method can also include changing a pressure within the vessel to be closer to atmospheric pressure, heating the assembly, or any combination thereof. In one embodiment, the method can be performed while keeping a cryogenic region substantially sealed, keeping a superconducting magnet energized, or a combination thereof. In a particular embodiment, the method can be used when servicing the assembly, such as a cryocooler, while trying to reduce down time of the system and operating costs. The method will be described in more detail with respect to the figures and text below.

A few terms are defined or clarified to aid in understanding of the terms as used throughout this specification. The term "cryogenic region" is intended to mean a region that can be exposed to a cryogenic liquid or gas during normal operating conditions of a system.

The term "ice" is intended to mean a solid material that can be a liquid or a gas when such material is at substantially room temperature and atmospheric pressure.

When referring to temperatures, "K" is degrees Kelvin, "C" is degrees Celsius, "R" is degrees Rankine, and "F" is degrees Fahrenheit.

The term "thermal connection" is intended to mean a direct or indirect physical connection between two or more objects, designed to allow significant thermal conduction between such two or more objects. In one embodiment, a thermal connection can occur with direct contact between two objects, and in another embodiment, a thermal connection between two spaced-apart objects can occur when a thermally conductive element (e.g., a metallic strap) is physically connected to those two spaced-apart objects.

The term "thermally conductive" is intended to mean that a material having a thermal conductivity of at least 10 cal/$(cm^2)(K/cm) \times 10^{-3}$ (approximately 2.5 Btu/(hr)(ft$^2$)(R/ft)).

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and components, assemblies, and systems are conventional and may be found in textbooks and other sources within the superconducting, cryogenic, and medical device arts.

Before describing the methods in more detail, the system and its assemblies and subassemblies are briefly addressed. An exemplary system for use with the methods can include the MRI system 100 as illustrated in FIGS. 1 and 2, and much of the discussion regarding the methods be described with respect to the MRI system 100. In another embodiment, the method can be used for one or more other systems, such as a system that includes a superconductor (e.g., a transmission or distribution cable, a transformer, a fault current limiter, one or more other suitable electronic devices, or any combination thereof), a cryogenic sub-system (e.g., an ion implanter, a mass spectrometer, a thin-film deposition tool, one or more other suitable low temperature or low pressure apparatuses, or any combination thereof), or any combination of a superconductor and a cryogenic sub-system. In another embodiment, the bellows seal 232 can be replaced by a sliding o-ring assembly (not illustrated), which can allow for movement of the housing 222 without breaking the seal of the cryogenic region 264. In still another embodiment, the manual valve 290 can be replaced by an automatic valve that is coupled to the controller 110. In yet another embodiment, the thermally conductive elements 284 may be a wire, sheet metal, or the like. Thus, the methods described herein are not limited only for use with the MRI system 100 as illustrated in FIGS. 1 and 2.

Figure 3:
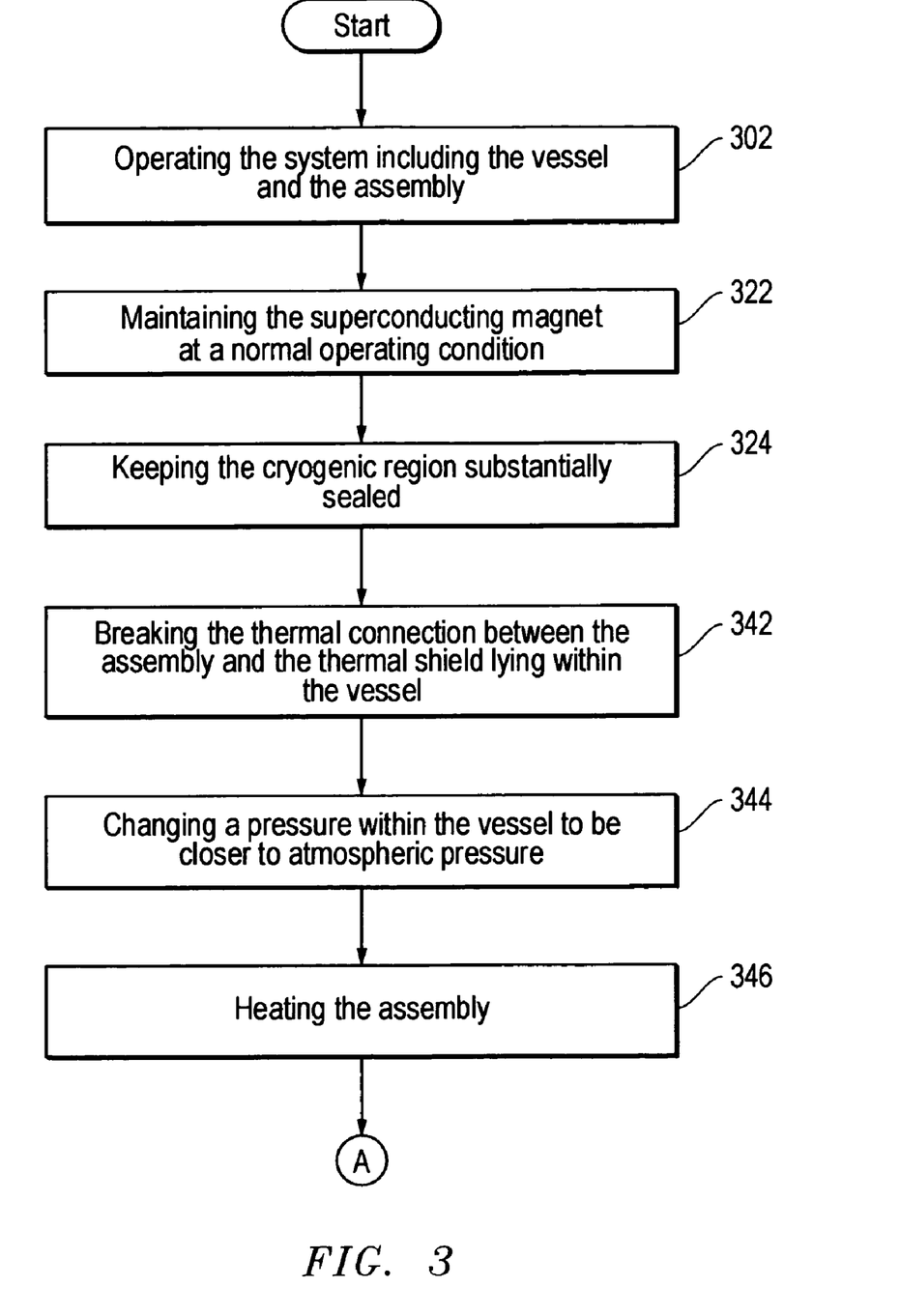
FIGS. 3 and 4 include a flow chart for a method of using the system.

FIGS. 3 and 4 include a flow chart for an exemplary, non-limiting embodiment of a method of using a system, such as the MRI system 100. As appropriate, references to other figures may be made to improve understanding of the methods. The method can include operating the system that includes the vessel and the assembly, at block 302 in FIG. 3. In one embodiment, the system can be the MRI system 100, and the assembly can be the cryocooler 120. The cryocooler 120 can be any type capable of achieving a desired operating temperature range. The cryocooler 120 can include a Braton cycle cryocooler, a Stirling cycle cyrocooler, a Gifford-Mc-Mahon ("G-M") cycle cyrocooler, a pulse tube cryocooler, etc. The cryocooler 120 illustrated in FIG. 1 includes a G-M cycle cryocooler.

In a particular embodiment as illustrated in FIG. 2, the cryocooler 120 is in a first position, and more particularly, the housing 222 of the cryocooler 120 contacts a surface of the transitional wall 246 at area 248. In another embodiment (not illustrated), a thermally conductive element (e.g., a metallic spring or ring) could contact each of the cryocooler 120 and the surface of the transitional wall 246.

The heat shield 182 may be at a temperature less than 173 K, and in a particular embodiment, less than 80 K, and in a more particular embodiment, less than 50 K. The temperature interior space 160 may depend on the system and cryogen used. In one embodiment, the temperature of the interior space 160 may be relatively close to the vaporization temperature of the cryogen used. In one embodiment, the interior space 160 may be at a temperature less than 173 K, and in a particular embodiment, less than 95 K, and in a more particular embodiment, less than 9 K. When the cryogen is helium, the interior space 160 may be in a range of approximately 4 to 5 K. After a period of normal operation (i.e., using the MRI system 100 for generating data in MRI applications), routine maintenance or other service for the cryocooler 120 or other portion of the MRI system 100 may be needed or desired.

In one embodiment, the method can include maintaining the superconducting magnet at a normal operation condition, at block 322, keeping the cryogenic region substantially sealed, at block 324, or a combination thereof during a portion or all of the methods as described herein. In one embodiment, the superconducting magnet 190 can remain at field or otherwise be energized. In a particular embodiment, current would continue to flow the superconducting magnet 190. In another embodiment, a plurality of normal operating conditions of the superconducting magnet 190 may be maintained. The cryogenic region can include one or more regions in which the cryogen (liquid, gas, or a combination thereof) is to be contained during normal operation of the MRI system 100. In one embodiment as illustrated in FIG. 2, the cryogenic region can include the interior space 160 of the vessel 140 and the transitional space 264 adjacent to the transitional wall 246. The cryogenic region does not include the ambient 162 along the outer wall 142. When the superconducting magnet 190 is maintained at a normal operating condition and the cryogenic region remains substantially sealed, servicing procedures may be simplified, reduce down time and maintenance costs, improve safety, or any combination thereof.

In one embodiment, the method can further include breaking the thermal connection between the assembly and the thermal shield disposed within the vessel, at block 342. In another embodiment, the method can include separating the assembly and a surface within the vessel, such that the assembly and the surface are spaced apart from each other after separating. In still another embodiment, the method can include moving the cryocooler from the first position to a second position such that the cyrocooler is spaced-apart from the transitional wall, wherein during moving, the cryogenic region remains substantially sealed.

Figure 5:
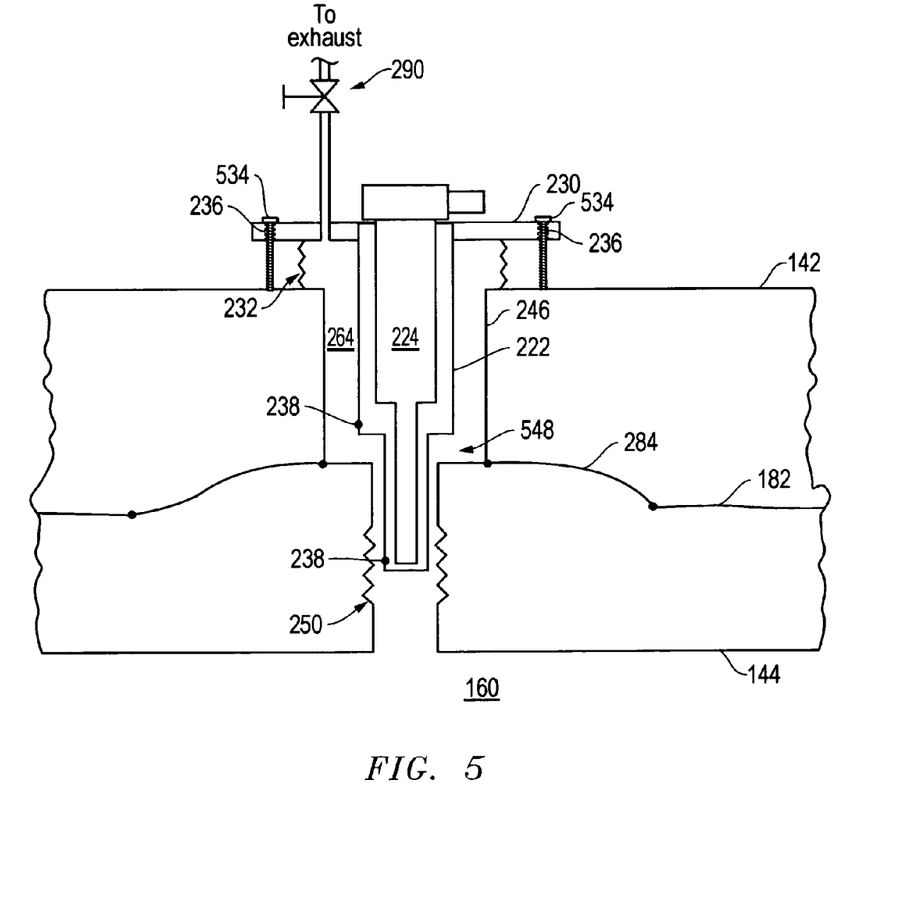
FIG. 5 includes an illustration of the portion in FIG. 2 after breaking a thermal connection.

In a particular embodiment, the securing element 234 may include a nut that is removed. The nut helps to hold the assembly at the first position. The method can include removing the nut and installing one or more jacking screws 534 into one or more of the holes 536 within the flange 230 at one or more locations adjacent to where the securing element(s) were removed, as illustrated in FIG. 5. The method can further include turning the jacking screw(s) 534 until the assembly reaches a second position. At this point in the process, the housing 222 of the cryocooler 120 is spaced apart from surface of the transitional wall 246, as illustrated by a gap 548. In one embodiment, the gap 548 is no greater than 10 mm, and in another embodiment, the gap is at least 0.1 mm. In a particular embodiment, the gap can be in a range of 1 to 3 mm. After reading this specification, skilled artisans will appreciate that can the gap 548 can be less than 0.1 mm or more than 10 mm.

In another embodiment (not illustrated), an object could be used. For example, after removing the securing elements 234, a scissors-type lift may be used instead of the jacking screws 534. In yet another embodiment, a solid object may be placed between the flange 230 and the outer wall 142 underlying the flange 230. In a particular embodiment, the solid object can be C-shaped, semicircular, or the like and have a thickness corresponding to the gap 548. In still another embodiment (not illustrated), a jig or other device could be used. After reading this specification, skilled artisans will appreciate that other methods, objects, or devices can be used.

Although not illustrated, an alternative design for the vessel could allow for reducing the distance between the outer wall 142 and the inner wall 144. In a particular embodiment, the inner wall 144 could be in a fixed position and a force could be applied to the outer wall 142 to compress the flexible portion 250 of the transitional wall 246. Alternatively, the outer wall 142 could be in a fixed position and a force could be applied to the inner wall 144, or in still another embodiment, forces could be applied to both the outer wall 142 and the inner wall 144.

Returning to FIG. 3, the method can further include changing a pressure within the vessel 140 to be closer to atmospheric pressure, at block 344. During normal operation, the pressure within the vessel 120 may be in a range of approximately 10 to 28 KPa (approximately 1.5 to 4 pounds per square inch or "psi") gauge. Referring to FIG. 1, the manual valve 290 may be opened (partially or completely) to allow some of the cryogenic gas within the transitional space 264 to flow to the exhaust. In one embodiment, the pressure may be less than 9 KPa (approximately 1.4 psi) gauge. In a particular embodiment, the pressure may be in a range of approximately 0.1 KPa to 0.2 KPa (approximately 0.01 to 0.02 psi) gauge. In other embodiment, the reduced pressure may be higher than 9 KPa or lower than 0.1 KPa. The pressure within the transitional space 264 may be lower than the pressure within the interior space 160 to reduce the likelihood that too much warm cryogenic gas (near or at room temperature near the flange 230) would flow into the interior space 160. In a particular embodiment, positive pressure (i.e., the pressure within the cryogenic region is higher than the pressure of the ambient 162) may be used to reduce the likelihood that air enters the cryogenic region.

Returning to FIG. 3, the method can still further include heating the assembly, at block 346. Referring to FIGS. 1 and 2, the controller 110 can send a signal to the heating elements 238 within the cryocooler 120 to activate the heating elements 238. The heating can be used to increase the temperature within the housing 222 to at least 273 K to substantially reduce the likelihood of forming ice within the housing 222, on the cooling sub-assembly 224, or any combination thereof. In a particular embodiment, the temperature of the housing 222 can be in a range of approximately 250 to 350° K. In another embodiment (not illustrated), the heating elements 238 could be located outside and adjacent to the cryocooler (assembly) 120. In still another embodiment, heating the assembly can also include allowing the assembly to increase in temperature without the use of the heating elements 238. For example, a room temperature or heated gas may flow inside the housing 222, cooling sub-assembly 224, external portion 226, motor 228, or any combination thereof. Alternatively, passive heating can be used, wherein, the cooling sub-assembly 224 is turned off, and the housing 222, cooling sub-assembly 224, or both are allowed to get closer to room temperature (via thermal conduction within the cyrocooler 120).

Heating of the assembly may be performed before, during, or after breaking the thermal connection between the assembly and the thermal shield. In one embodiment, the thermal connection may be broken before heating starts. In another embodiment, the thermal connection may be broken after heating starts and before heating is completed. After reading this specification, skilled artisans will appreciate that the order of heating and breaking the thermal connection can be tailored to their needs or desires.

When the thermal connection is broken before or during heating, the gap 548 reduces heat transfer from the assembly (being heated) to the heat shield 182. Therefore, down time and energy consumption related to heating may be reduced as compared to a conventional method where the gap 548 is not used formed. The reduced pressure within the interior space 160 can reduce the likelihood that heated gas within the transitional space 264 (heated due to thermal conduction from the assembly during heating) will cause a quenching event, the liquid within the interior space 160 to boil off, or the like. Although not illustrated in FIG. 1, one or more temperature sensors, one or more pressures, or any combination thereof may be located within the MRI system 100 and coupled to the controller 110 to allow for control of temperature, pressure, or both within the cryocooler 120, the vessel 140, another portion of the MRI system 100, or any combination thereof.

Figure 4:
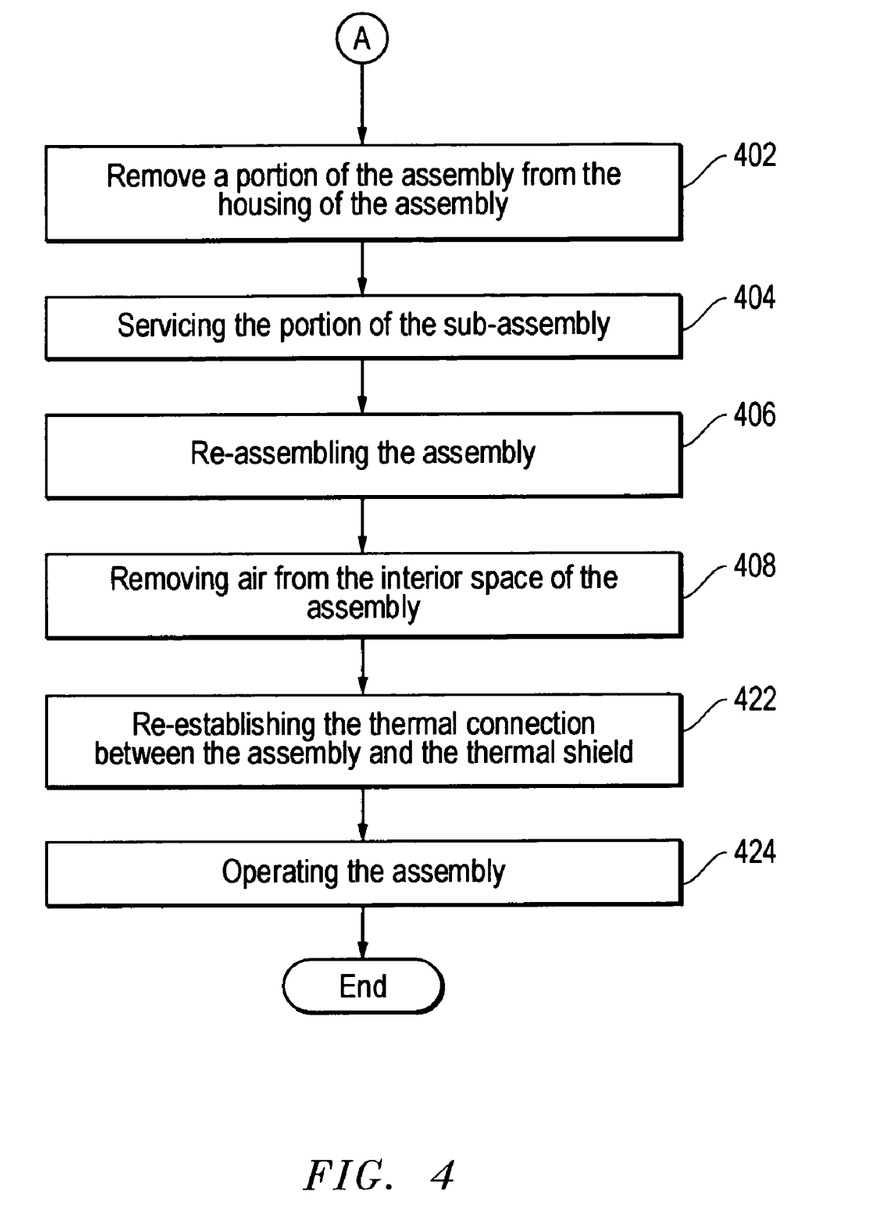
Figure 6:
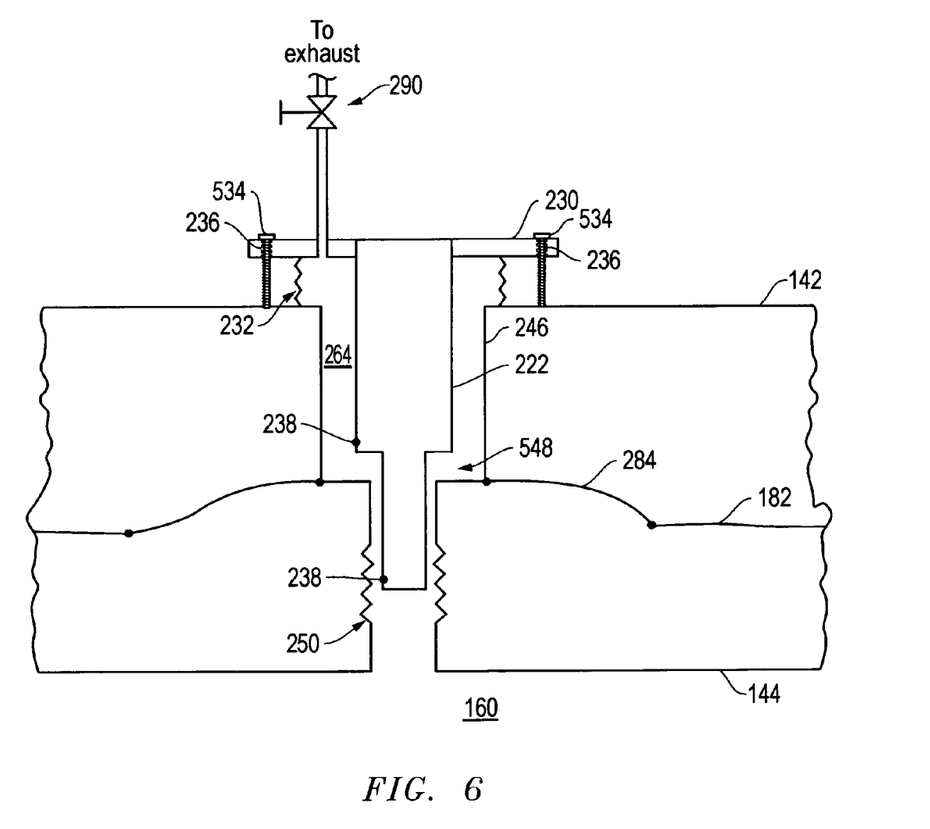
FIG. 6 includes an illustration of the portion in FIG. 5 after removing a portion of an assembly.

The method can also include removing a portion of the assembly from the housing of the assembly, at block 402 in FIG. 4. In one embodiment, the entire cooling sub-assembly 224 can be removed from the housing 222 as illustrated in FIG. 6, and in another embodiment, removing the cooling sub-assembly can include removing only part (not all) of the cooling sub-assembly 224 from the housing 222 (not illustrated). In still embodiment, the portion being removed could be part or all of the external portion 226, the motor 228, or any combination thereof. The method can also include servicing the portion of the assembly, at block 404 in FIG. 4. The service can widely vary and include routine maintenance or other service. The housing 222 may remain within the transitional space 264. The interior of the housing 222, heating elements 238, one or more temperature sensors, or any combination thereof may be also be serviced. For the purposes of this specification, servicing can also include repairing or replacing one or more components.

In still embodiment, the portion being removed could be part or all of the external portion 226, the motor 228, or any combination thereof. The external portion 226, the motor 228, or both may also be serviced. The interior of the external portion 226 and the motor 228 may be sealed and include the cryogen. Although ice would not form in the external portion 226 or motor 228 if air were present, air could migrate into the cooling sub-assembly 224 and cause ice to form which could cause damage when the cooling sub-assembly. Prevention of ice formation is described in more with regard to removing air from the assembly. Thus, breaking the thermal connection and heating the assembly may be performed even if it only involves part of the assembly that is substantially at room temperature. After reading this specification, skilled artisans will appreciate that the repairing or replacing may be performed using a conventional or proprietary procedure.

The method can further include re-assembling the assembly, at block 406 in FIG. 4. The same portion (e.g., the same cooling sub-assembly 224, external portion 226, motor 228, or any combination thereof) or a different portion (e.g., a different cooling sub-assembly 224, external portion 226, motor 228, or any combination thereof) can be the cooling sub-assembly that is inserted into the housing 222.

The method can still further include removing air from the interior space of the assembly, at block 408 in FIG. 4. Air may enter the housing 222, the cooling sub-assembly 224, external portion 226, motor 228, adsorb onto surfaces within the housing 222 or any part of the cooling sub-assembly 224, external portion 226, motor 228, or any combination thereof. Air may form ice when taken to a temperature when different gases within air (water vapor, oxygen, nitrogen, argon, etc.) are cooled below their melting points. Helium may flow through the interior of the housing 222, the cooling sub-assembly 224, external portion 226, motor 228, or any combination thereof to reduce the amount of ice that may form within portions of the assembly that may be exposed to very low temperatures, e.g., below 50 K. In another embodiment, the housing 222, the cooling sub-assembly 224, external portion 226, motor 228, or any combination thereof may be evacuated and then backfilled with helium. In another system (not illustrated) where a different cryogen, such as xenon (boiling point of 168 K), is used, dry air could be used to remove the moisture and could be left within the housing 222, the cooling sub-assembly 224, external portion 226, motor 228, or any combination thereof. The controller 110 may deactivate the heating elements 238 if they have not previously been deactivated.

The method can also include re-establishing the thermal connection between the assembly and the thermal shield, at block 442. The procedure described with respect to block 342 in FIG. 3 is reversed. Thus, the MRI system 100 can go from the state as illustrated in FIG. 5 and return to the state as illustrated in FIG. 2.

The method can further include operating the assembly (e.g., the cryocooler 120), at block 444 in FIG. 4. In one embodiment, the controller 110 may send a signal to the cyrocooler 120 so that the cooling sub-assembly 224 is activated, and the MRI system 100, including the cryocooler 120, is at or near its normal operating temperature. One or more additional actions may be performed before the MRI system 100 returns to its normal operating mode. The MRI system 100 can then operate in its normal operating mode, which could include scanning patients.

The methods described herein may be used for a variety of systems as previously described. In addition, the methods may be useful for any servicing portions of a system that may be exposed to a cryogenic ambient. Thus, the assembly could include sensors or electronics that can be used to operate or monitor the system. In one embodiment (not illustrated), a temperature sensor may be used to determine the temperature of a liquid cryogen within a cryogenic vessel. The temperature sensor could be within a housing.

A method can be used for servicing the temperature sensor. A housing, which includes temperature sensor, can be moved out of the liquid cryogen. The sealed connection (e.g., a bellows seal, a sliding o-ring assembly, or the like) can allow the cryogenic region to remain substantially sealed while the temperature sensor is serviced (e.g., repaired or replaced).

Thus, the concepts described herein can be adapted to other applications and are not limited to servicing cryocoolers for MRI systems.

While the description above has been directed to helium, one or more other cryogen may be used. The cryogen can have a vaporization temperature lower than the lowest normal operating temperature within the interior space 160. In another embodiment, the cryogen may include nitrogen, oxygen, helium, methane, xenon, or any combination thereof that may be used in place of or in conjunction with helium. In a particular embodiment, the cryogen has a boiling point (e.g., vaporization point at substantially atmospheric pressure) no greater than 173 K.

In another alternative embodiment, the assembly may contact the thermal shield. Referring to FIG. 2, the thermal shield may be extended so that it is exposed within the transitional area. In this embodiment (not illustrated), the thermal conductive element 284 may be eliminated. In still another embodiment (not illustrated, the transitional wall 246 may have a continuous taper (i.e., no sharp bends), and the housing 222 can have an outer surface with a corresponding shape.

The embodiments described herein may allow for the use of one or more methods that may be beneficial. None of the aspects, embodiments, features, benefits or other advantages, or any combination thereof are not to be construed as critical or essential.

The broken thermal connection (between the assembly and the thermal shield) during heating the assembly can reduce the time and energy used to heat the assembly. If heating the assembly would occur without breaking the thermal connection, the heating elements would also be heating the thermal shield 182, which has a significant mass. The heating would not only be slower but would also risk increasing the temperature within the interior space 160 and could result in a quench event, boiling off the liquid cryogen, result in an overpressure condition, damage the MRI system 100, additional downtime or costs, or any combination thereof.

The reduction in pressure within the cryogenic region may help to reduce heating within the interior space 160. When heating the assembly, the vapor (from the liquid cryogen) near the assembly may expand. Thus, the local pressure within the transitional space 264 may increase with a reduced likelihood that too much of the warmer vapor from the transitional space 264 would enter the interior space 160 and cause a quench event, boiling off the liquid cryogen, result in an overpressure condition, or any combination thereof.

The bellows seal 232, the flexible portion 250, sliding o-ring assembly (not illustrated), or any combination thereof can help to keep the cryogenic region substantially sealed while the thermal connection involving the assembly is broken. The seal reduces the likelihood that room temperature air will enter the interior space 160, and thus reduces the likelihood that a quench event, boiling off the liquid cryogen, result in an overpressure condition, or any combination thereof will occur due to the warmer air entering the interior space 160. The seal may also help to reduce the likelihood that ice will form within the interior space 160, transitional space 264, or correspond surfaces that define those spaces, or any combination thereof. When the thermal connection is re-established, a good thermal contact can be made at area 248 because ice should not be present along the surfaces of the housing 222 and transitional wall 246 at the area 248. If ice were present, the ice would substantially decrease the efficiency of the assembly after servicing because the assembly would work harder to get the thermal shield 182 within the designed or specified operating temperature range. In an extreme case, the thermal shield 182 may not even reach its designed or specified operating temperature range. Therefore, by keeping the cryogenic region substantially sealed, time and costs associated with maintenance of the assembly are significantly reduced.

The MRI system 100 can continue to operate in a persistent mode while servicing the assembly (e.g., the cryocooler 120). When the MRI system 100 includes a superconducting magnet, the superconducting magnet can remaining at operating magnetic field levels. If the superconducting magnet would be reduced to a substantially zero magnetic field, a significant amount of cryogen could be lost, and thus, additional cryogen may be added sooner than it would otherwise. Also, ramping down the superconducting magnet and then ramping it back up takes time and requires specialized equipment, which can increase the unavailability of the system and the cost of the service. Therefore, a method of servicing the assembly without having to shut down other portions of the system (e.g., taking a superconducting magnet to substantially zero field) can be achieved.

Note that not all of the activities described above in the general description or the examples are required, that a portion of a specific activity may not be required, and that one or more further activities may be performed in addition to those described. Still further, the order in which activities are listed is not necessarily the order in which they are performed.

In one embodiment, when servicing the assembly, the cryogenic region does not need to be substantially sealed, the superconducting magnet does not need to be kept energized, or any combination thereof. The pressure within the cryogenic region does not have to be reduced before heating the assembly. Along similar lines, if the pressure is changed, it may be changed before the thermal connection between the assembly and thermal shield is broken. After reading this specification, skilled artisans will appreciate that other activities may not be required or may be performed in a different order.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a method of using a system, including a vessel, can include breaking a thermal connection between an assembly and a thermal shield disposed within the vessel. The method can also include heating the assembly, wherein a cryogenic region adjacent to the assembly remains substantially sealed.

In one embodiment of the first aspect, before breaking the thermal connection, the assembly can contact a surface of the vessel. During heating the assembly, the assembly can be spaced apart from the surface. In a particular embodiment, during heating the assembly, the vessel can include a liquid cryogen. In another embodiment, breaking the thermal connection can include moving a housing of the assembly. In still another embodiment, heating the assembly can further include activating a heating element within or adjacent to a housing of the assembly. In yet another embodiment, the method can further include maintaining a superconducting magnet at a normal operating condition within the vessel during breaking the thermal connection and heating the assembly.

In a further embodiment of the first aspect, the method can further include changing a pressure within the vessel to be within approximately 9 KPa of atmospheric pressure. In another further embodiment, heating the assembly can further include allowing an interior of the assembly to reach a temperature in a range of approximately 250 to 350 K. In still another embodiment, the method can further include removing a portion of the assembly from a housing of the assembly. In yet a further embodiment, the system includes a magnetic resonance imaging system. In another embodiment, heating the assembly is performed after breaking the thermal connection.

In a second aspect, a method of using a system, including an assembly and a vessel, can include separating the assembly and a surface within the vessel, such that the assembly and the surface are spaced apart from each other after separating. The method can also include changing a pressure within the vessel to be closer to atmospheric pressure, as compared to the pressure before changing the pressure.

In one embodiment of the second aspect, the method can further include heating the assembly to a temperature in a range of approximately 250 to 350 K after separating the assembly and wall. In another embodiment, a cryogenic region adjacent to the assembly can remain substantially sealed after separating the assembly and the surface. In still another embodiment before separating the assembly and the surface, the assembly can be thermally connected to a thermal shield within the vessel, and after separating the assembly and the surface, the assembly can be thermally disconnected from the thermal shield. In yet another embodiment, separating the assembly and the surface can include moving a housing of the assembly while maintaining a seal of a cryogenic region within the vessel.

In a further embodiment of the second aspect, the method can further include keeping a superconducting magnet energized within the vessel during separating the assembly and the surface and heating the assembly. In another further embodiment, the method can further include removing a portion of the assembly from a housing of the assembly. In still a further embodiment, the system includes a magnetic resonance imaging system.

In a third aspect, a method of using a system can include operating the system including a vessel and a cryocooler. The vessel can include a thermal shield and a cryogenic region, wherein the cryogenic region includes liquid helium adjacent to a superconducting magnet. The thermal shield can be at a temperature higher than the liquid helium. The cyrocooler can include a housing, a cooling sub-assembly, and a flange, wherein the cooling sub-assembly is disposed within the housing, and the cryogenic region can lie outside and be exposed to the housing. The housing can be in a first position and is thermally connected to the thermal shield. The method can also include moving the cryocooler from the first position to a second position such that the cyrocooler is thermally disconnected from the thermal shield, wherein during moving, the cryogenic region remains substantially sealed. The method can further include changing a pressure within the vessel to be closer to atmospheric pressure, as compared to the pressure when operating the system, heating the housing to a temperature in a range of approximately 250 to 350 K, and removing a portion of the assembly from the housing of the assembly. The method cans still further include keeping the superconducting magnet energized during moving the cryocooler, changing the pressure, heating the housing, and removing the cooling sub-assembly.

In one embodiment of the third aspect, the method can further include inserting the portion of the assembly into the housing, removing air from an interior space of the housing, moving the housing from the second position to the first position, and operating the cryocooler after removing air from the interior of the housing. The cryogenic region may remain substantially sealed during heating the housing, removing the cooling sub-assembly, inserting the cooling sub-assembly, removing the air, and moving the housing from the second position to the first position.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that a structural substitution, logical substitution, or another change may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed subject matter requires more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of using a system comprising an assembly and a vessel, wherein the method comprises:
   providing the vessel including a wall that at least partly defines an interior space, wherein a superconducting component is disposed within the interior space, and at least a portion of an assembly is exposed to the interior space;
   separating the assembly and a surface within the vessel, such that the assembly and the surface are spaced apart from each other after separating; and
   lowering a pressure within the interior space of the vessel to be closer to atmospheric pressure, as compared to the pressure before lowering the pressure.

2. The method of claim 1, further comprising heating the assembly to a temperature in a range of approximately 250 to 350 K.

3. The method of claim 2, wherein heating the assembly is performed after separating the assembly and a wall.

4. The method of claim 1, wherein a cryogenic region adjacent to the assembly remains substantially sealed after separating the assembly and the surface.

5. The method of claim 1, wherein:
   before separating the assembly and the surface, the assembly is thermally connected to a thermal shield within the vessel; and
   after separating the assembly and the surface, the assembly is thermally disconnected from the thermal shield.

6. The method of claim 1, wherein separating the assembly and the surface comprises moving a housing of the assembly while maintaining a seal of a cryogenic region within the vessel.

7. The method of claim 1, wherein:
   the superconducting component comprises a superconducting magnet; and
   the method further comprises keeping the superconducting magnet energized within the vessel during separating the assembly and the surface and heating the assembly.

8. The method of claim 1, further comprising removing a portion of the assembly from a housing of the assembly.

9. The method of claim 1, wherein the system comprises a magnetic resonance imaging system.

10. A method of using a system comprising:
    operating the system including a vessel and a cryocooler, wherein:
    the vessel includes a thermal shield and a cryogenic region, wherein the cryogenic region includes liquid helium adjacent to a superconducting magnet;
    the thermal shield is at a temperature higher than the liquid helium;
    the cryocooler includes a housing, a cooling sub-assembly, and a flange, wherein the cooling sub-assembly is disposed within the housing;
    the cryogenic region lies outside and is exposed to the housing; and
    the housing is in a first position and is thermally connected to the thermal shield; and
    moving the cryocooler from the first position to a second position such that the cryocooler is thermally disconnected from the thermal shield, wherein during moving, the cryogenic region remains substantially sealed;
    lowering a pressure within a region of the vessel adjacent to the cryocooler;
    heating the housing to a temperature in a range of approximately 250 to 350 K;
    removing a portion of the cryocooler from the housing of the cryocooler; and
    keeping the superconducting magnet energized during moving the cryocooler, changing the pressure, heating the housing, and removing the cooling sub-assembly.

11. The method of claim 10, further comprising:
    inserting the portion of the cryocooler into the housing;
    removing air from an interior space of the housing;
    moving the housing from the second position to the first position; and
    operating the cryocooler after removing air from the interior of the housing,
    wherein the cryogenic region remains substantially sealed during heating the housing, removing the cooling sub-assembly, inserting the cooling sub-assembly, removing the air, and moving the housing from the second position to the first position.

* * * * *